United States Patent [19]
Boguszewicz

[11] Patent Number: 5,672,899
[45] Date of Patent: Sep. 30, 1997

[54] POWER SEMICONDUCTOR SWITCH WITH AN INTEGRATED CIRCUIT

[75] Inventor: Remigiusz Boguszewicz, Essen, Germany

[73] Assignee: Hanning Electronic GmbH & Co., Germany

[21] Appl. No.: 454,246

[22] PCT Filed: Dec. 8, 1993

[86] PCT No.: PCT/DE93/01178

§ 371 Date: Jun. 13, 1995

§ 102(e) Date: Jun. 13, 1995

[87] PCT Pub. No.: WO94/14195

PCT Pub. Date: Jun. 23, 1994

[30] Foreign Application Priority Data

Dec. 17, 1992 [DE] Germany ............... 42 42 669.3

[51] Int. Cl.$^6$ ............ H01L 29/76; H01L 29/94; H01L 31/062; H01L 31/113
[52] U.S. Cl. .............. 257/394; 257/392; 257/393; 257/504; 257/506
[58] Field of Search ............... 257/392, 393, 257/394, 504, 506, 544, 546

[56] References Cited

U.S. PATENT DOCUMENTS 5,040,043 8/1991 Ohno ............................ 357/42
5,045,900 9/1991 Tamagawa ..................... 357/23.4

FOREIGN PATENT DOCUMENTS 60-100469 4/1985 Japan ............... H01L 29/78
62-183554 11/1987 Japan ............... H01L 27/08

Primary Examiner—Sara W. Crane
Assistant Examiner—Douglas Wille
Attorney, Agent, or Firm—Rothwell, Figg, Ernst & Kurz, P.C.

[57] ABSTRACT

A semiconductor arrangement with a vertical power semiconductor switch and an integrated CMOS or bipolar circuit is provided, whereby the integrated CMOS or bipolar circuit is arranged on a semiconductor islet insulated from a first semiconductor material region by a buried insulating layer. The first semiconductor material region is included as a part of the structure of the power semiconductor switch. The buried insulating layer is surrounded by a second semiconductor material region arranged between it and the first semiconductor material region, the doping of which is the opposite of that of the first semiconductor material region. The second semiconductor region is coupled to the first semiconductor region by a circuit. This circuit does not directly connect the potential of the second semiconductor material region with the potential of the first semiconductor material region. The circuit limits the potential of the second semiconductor material region to values smaller than those capable of influencing the integrated circuit.

4 Claims, 1 Drawing Sheet

, 
POWER SEMICONDUCTOR SWITCH WITH AN INTEGRATED CIRCUIT

BACKGROUND OF INVENTION

1. Field of the Invention

The present invention relates to the field of power semiconductor switches.

2. Description of the Background Art

The invention relates to a semiconductor arrangement according to the preamble of the claims, in which a vertical power semiconductor component, e.g. a D-MOS transistor, an IGBT, a thyristor or similar is monolithically integrated, together with a circuit which serves, for example, to drive or protect the component, in a switching circuit. Such components, which play an increasingly important role in many appliances in the field of power electronics, are called smart-power elements.

SUMMARY OF THE INVENTION

In accordance with the present invention, a semiconductor arrangement with a vertical power semiconductor switch and an integrated CMOS or bipolar circuit is provided, whereby the integrated CMOS or bipolar circuit is arranged on a semiconductor islet insulated from a first semiconductor material region by a buried insulating layer. The first semiconductor material region is included as a part of the structure of the power semiconductor switch. The buried insulating layer is surrounded by a second semiconductor material region arranged between it and the first semiconductor material region, the doping of which is the opposite of that of the first semiconductor material region. The second semiconductor region is coupled to the first semiconductor region by a circuit. This circuit does not directly connect the potential of the second semiconductor material region with the potential of the first semiconductor material region. The circuit limits the potential of the second semiconductor material region to values smaller than those capable of influencing the integrated circuit.

DETAILED DESCRIPTION OF THE PREFERRED EMBODIMENTS

Figure 1:
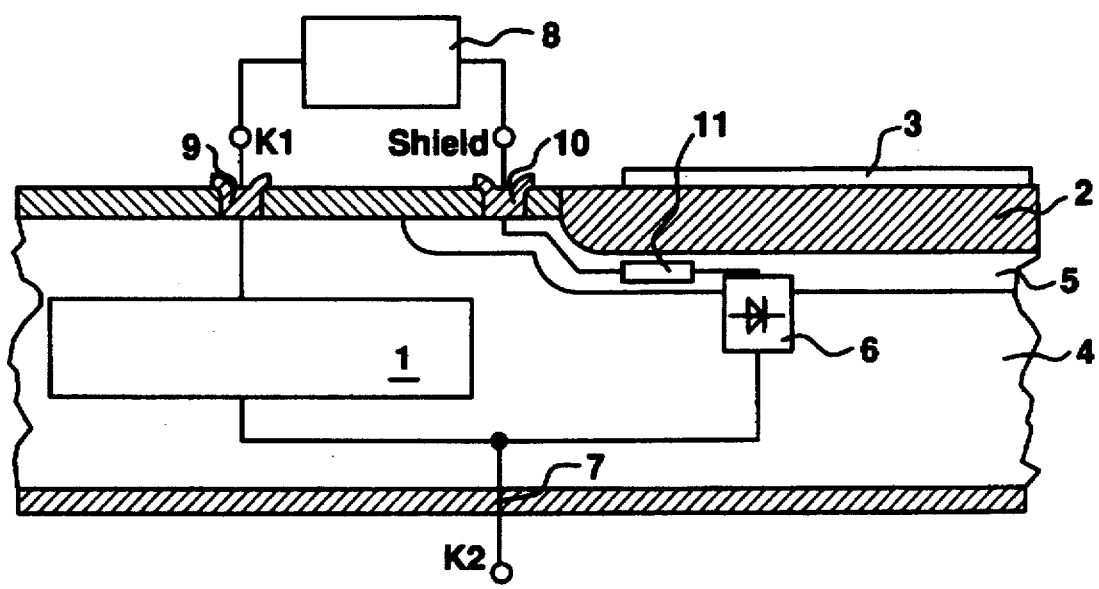
FIG. 1 is a schematic view of a semiconductor arrangement in accordance with one embodiment.

In the smart-power element described here, the switching circuit is electrically separated from the power semiconductor by a dielectric insulation generated, for example, by SIMOX. At approx. 400 nm, the thicknesses of the insulation which can be achieved are typically so low that the potentials of the power semiconductor interfere severely with the circuit. The interferences are so serious that until now, it has not been possible to usefully use such semiconductor components, particularly in high-voltage applications (mains applications).

A shield under the region to be protected may be considered an obvious solution to this problem. Such shields are often used in semiconductor arrangements, either to be used themselves reverse-biased as an insulating element (junction insulation) or, as in JP-OS SHO 60-100469, to prevent the influence of the back-gate effect. However, in smart-power applications this proposition has a decisive disadvantage, which prevents the protection from functioning. The diode region of the shield, the shield being directly connected with the source or emitter region of the power semiconductor, can be conductive and thereby flooded in this respect with charge carriers. If the component subsequently switches off, the charge carriers have to recombine. For the recombination time the shield is therefore a low-resistance connection to the vertical power component. The conductivity of the shield is not sufficient to guarantee an effective protection for the electronic circuit.

The invention is therefore based on the task of creating a semiconductor arrangement which makes it possible, on the same substrate of a vertical power semiconductor, safely to protect the circuit to be insulated from interference even when the component is operated in reverse, when the shield is normally flooded with charge carriers.

The invention succeeds in solving the task with little additional expenditure. For this purpose, the semiconductor element consists of a vertical power semiconductor switch 1, which can be one of any of the well-known types. We quote here, in particular, D-MOS transistors, IGBTs, bipolar transistors, MCTs, thyristors and GTOs. The earth potential (reference potential for driving the component) is connected at the K1 connection 9. The integrated electronic circuit 3 is insulated by an insulating layer 2 from the part of the semiconductor switch which represents the vertical power transistor. This insulating layer 2 can be generated by SIMOX or dielectric insulation based on other methods and insulates the circuit from the other elements. A shield, which can be connected via a contact window 10, is then created around the thus resulting insulation islet with a second semiconductor material region 5. The K2 connection 7 for the vertical power semiconductor switch 1 is located on the reverse side of the semiconductor. The potential can be switched at a very high speed (values of 40 KV/µs can be achieved with MOS-transistors). This causes high dielectric displacement currents, which influence the drive circuit 3. This problem can be eliminated by a shield which is connected with the earth potential of the circuit. The disadvantage of the direct coupling is that, in reverse operation, the diode region 6 between the semiconductor material regions 4 and 5 can become conductive due to flooding with charge carriers. In accordance with the task of the invention, which is to prevent the diode region from ever being operated such that it becomes conductive, between both semiconductor material regions 4 and 5 a circuit is provided, which is itself preferably part of the circuit 3 that allows the potential to float in a certain region. The circuit 8 limits the voltage swing to voltage values which are smaller than the voltages capable of influencing the circuit. These voltages typically lie in the region of only a few volts. One form illustrated in claim 2 are two antiparallel diodes which limit the potential difference to approx. ±0.6V. The circuit 8 prevents the semiconductor material region 5 from changing to a conductive state and thereby being flooded with charge carriers, which causes the said problems.

Figure 2:
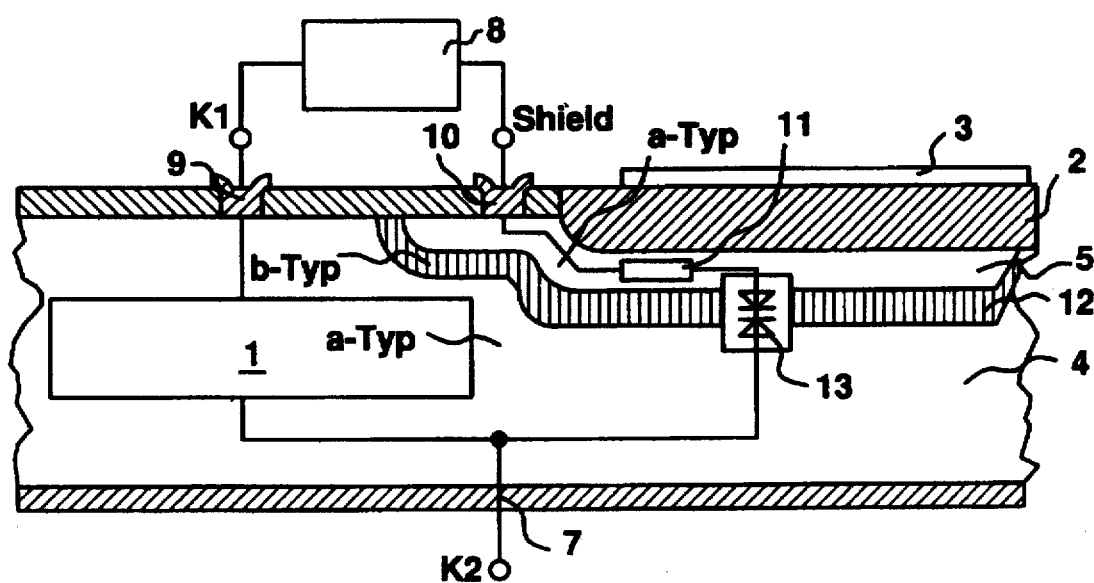
FIG. 2 is a schematic view of a semiconductor arrangement in accordance with another embodiment.

Another solution to the existing task illustrated in FIG. 2 could be the introduction of a second shield by means of an additional semiconductor material region 12, which is not directly connected with the semiconductor material region 5. Although this entails an additional step in the process, it is an alternative to the other embodiments of the inventive concept. The barrier layers of the two shields 12/5 are represented by two diodes connected in series but facing each other. This is also a means of preventing the semiconductor material region 5 from ever becoming conductive.

I claim:

1. A semiconductor arrangement with a vertical power semiconductor switch and an integrated CMOS or bipolar circuit, wherein the integrated CMOS or bipolar circuit is arranged on a semiconductor islet insulated from a first semiconductor material region by a buried insulating layer, and the power semiconductor switch comprises the first semiconductor material region as part of its structure, wherein:

a) the buried insulating layer is surrounded by a second semiconductor material region arranged between it and the first semiconductor material region, the doping of the second semiconductor region being opposite to that of the first semiconductor material region, and b) the second semiconductor material region is coupled to the first semiconductor material region via a circuit which prevents the second semiconductor material region from changing to a conductive state and allows the potential of the second semiconductor material region to float in a certain range, such that this potential is limited to values small enough to avoid interference with the integrated circuit.

2. The semiconductor arrangement of claim 1, wherein the circuit connecting the second semiconductor material region with the first semiconductor material region includes two antiparallel diodes.

3. The semiconductor arrangement of claim 1, wherein the circuit connecting the second semiconductor material region with the first semiconductor material region is fitted with a Zener diode with a low breakdown voltage.

4. The semiconductor arrangement of claim 1, wherein the circuit connecting the second semiconductor material region with the first semiconductor material region consists of two antiparallel diodes which are part of the integrated circuit.

* * * * *